United States Patent
Zeng et al.

(10) Patent No.: US 9,793,361 B2
(45) Date of Patent: Oct. 17, 2017

(54) THIN FILM TRANSISTOR, ARRAY SUBSTRATE AND DISPLAY DEVICE

(71) Applicant: BOE Technology Group Co., Ltd., Beijing (CN)

(72) Inventors: Qinghui Zeng, Beijing (CN); Zhuo Zhang, Beijing (CN); Seiji Fujino, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/770,652

(22) PCT Filed: Dec. 17, 2014

(86) PCT No.: PCT/CN2014/094095
§ 371 (c)(1),
(2) Date: Aug. 26, 2015

(87) PCT Pub. No.: WO2016/037435
PCT Pub. Date: Mar. 17, 2016

(65) Prior Publication Data
US 2016/0315102 A1 Oct. 27, 2016

(30) Foreign Application Priority Data
Sep. 10, 2014 (CN) .......................... 2014 1 056916

(51) Int. Cl.
*H01L 21/38* (2006.01)
*H01L 29/24* (2006.01)
(Continued)

(52) U.S. Cl.
CPC .......... *H01L 29/24* (2013.01); *H01L 29/0665* (2013.01); *H01L 29/0847* (2013.01); *H01L 29/22* (2013.01); *H01L 29/78696* (2013.01)

(58) Field of Classification Search
CPC ............. H01L 27/1222; H01L 27/1225; H01L 29/0665; H01L 29/24; H01L 29/22; H01L 29/78696; H01L 29/0847
See application file for complete search history.

(56) References Cited

U.S. PATENT DOCUMENTS

2001/0029054 A1* 10/2001 Maeda .............. G02F 1/136286
                                                         438/17
2005/0181587 A1* 8/2005 Duan ..................... B82Y 10/00
                                                         438/551
(Continued)

FOREIGN PATENT DOCUMENTS

CN          1452250 A      10/2003
CN          1619392 A       5/2005
(Continued)

OTHER PUBLICATIONS

Jun. 16, 2015—International Search Report and Written Opinion Appn PCT/CN2014/094095 with English Tran.
(Continued)

*Primary Examiner* — Cuong B Nguyen
*Assistant Examiner* — Samuel Park
(74) *Attorney, Agent, or Firm* — Banner & Witcoff, Ltd.

(57) ABSTRACT

A thin film transistor, an array substrate and a display device are disclosed, the thin film transistor comprises a gate electrode, an active layer located on the gate electrode, and a source electrode and a drain electrode respectively located at opposite sides of the active layer and both partially overlapped with the active layer; the active layer includes at least one first structure part and at least one second structure part, a material for the first structure part is semiconductor, and a material for the second structure part is predetermined conductor, and the predetermined conductor has better conductivity than the conductivity of the conducted semiconductor, and in response to that a turn-on voltage is applied (Continued)

to the gate electrode, a conductive passage located between the source electrode and the drain electrode includes the first structure part and the second structure part.

15 Claims, 4 Drawing Sheets

(51) Int. Cl.
    *H01L 29/786*     (2006.01)
    *H01L 29/06*     (2006.01)
    *H01L 29/08*     (2006.01)
    *H01L 29/22*     (2006.01)

(56) References Cited

U.S. PATENT DOCUMENTS

2009/0065784 A1*   3/2009   Kobayashi ............ H01L 29/04
                                                                          257/72

2009/0321718 A1*   12/2009   Liu ..................... H01L 51/0558
                                                                           257/24
2010/0163863 A1    7/2010   Yaegashi
2015/0034933 A1*   2/2015   Hong ................ H01L 29/66969
                                                                           257/40

FOREIGN PATENT DOCUMENTS

| CN | 1670926 A | 9/2005 |
|---|---|---|
| CN | 202405260 U | 8/2012 |
| CN | 103354218 A | 10/2013 |
| KR | 20080023475 A | 3/2008 |

OTHER PUBLICATIONS

Jul. 29, 2016—(CN)—First Office Action Appn 201410456916.8 with English Tran.

* cited by examiner

THIN FILM TRANSISTOR, ARRAY SUBSTRATE AND DISPLAY DEVICE

The application is a U.S. National Phase Entry of International Application No. PCT/CN2014/094095 filed on Dec. 17, 2014, designating the United States of America and claiming priority to Chinese Patent Application No. 201410456916.8 filed on Sep. 10, 2014. The present application claims priority to and the benefit of the above-identified applications and the above-identified applications are incorporated by reference herein in their entirety.

TECHNICAL FIELD

Embodiments of the present invention relate to a thin film transistor, an array substrate and a display device.

BACKGROUND

An array substrate of a display device includes a base substrate, and a plurality of gate lines and a plurality of data lines located the inside of the base substrate to intersect with each other to define a plurality of pixel units. In each of the pixel units, a TFT (thin film transistor) and a pixel electrode electrically connected with the TFT are provided.

Taking a bottom gate structure TFT as an example, the TFT in each of the pixel units includes a gate electrode provided on the base substrate, an active layer on the gate electrode, and a source electrode and a drain electrode respectively located at opposite sides of the active layer and both partially overlapped with the active layer. When a turn-on voltage is applied to the gate electrode, the active layer become conductive, so that electrons are transported from the source electrode to the drain electrode through the conducted active layer, so that holes are transported from the drain electrode to the source electrode through the conducted active layer. When a turn-off voltage is applied to the gate electrode, the active layer is cut off, so that the transportation of the electrons and holes between the source electrode and the drain electrode is interrupted.

In order to reduce contact resistance of the source electrode and the drain electrode with the active layer to improve the performance of the TFT, the TFT generally includes a first ohmic contact part located in the overlapping area between the source electrode and the active layer and a second ohmic contact part located at the overlapping area between the drain electrode and the active layer, and both are between the film layer on which the source electrode and the drain electrode are located and the active layer.

The material for the active layer is generally amorphous silicon semiconductor having relatively low conductivity, and therefore, after the turn-on voltage is applied to the gate electrode to make the active layer conductive, because the active layer has relatively low conductivity, the mobility of the electrons of the source electrode and the holes of the drain electrode is relatively low, and thus the on-state current of the TFT is relatively low, which causes the ratio of the on-state current to the off-state current of the TFT is relatively small, causing that the TFT cannot effectively drive a large area display device, for example, a large area OLED (organic light emitting diode).

Generally, in order to increase the on-state current of the TFT, the material for the active layer is generally a semiconductor material having relatively high conductivity, such as doped semiconductor, crystalized semiconductor or metal oxide semiconductor, or the like. However, because the conductivity of the material of the active layer is increased, although the on-state current of the TFT is increased, the off-state current of the TFT is also increased, resulting in the ratio of the on-state current to the off-state current of the TFT still low. Furthermore, the TFT cannot still effectively drive a large area display device.

SUMMARY

Embodiments of the present invention provide a thin film transistor, an array substrate and a display device by which the problem of the low ratio of the on-state current to the off-state current of the TFT can be resolved.

The TFT provided by an embodiment of the present invention includes a gate electrode, an active layer located over the gate electrode, and a source electrode and a drain electrode respectively located at opposite sides of the active layer and both partially overlapped with the active layer. The active layer includes at least one first structure part and at least one second structure portion, a material for the first structure part is semiconductor, and a material for the second structure part is predetermined conductor, and the predetermined conductor has conductivity better than that of the semiconductor when being conducted. In response to that a turn-on voltage is applied to the gate electrode, conductive passages located between the source electrode and the drain electrode includes the first structure part and the second structure part.

For example, the TFT further includes, between the film layer on which the source electrode and the drain electrode are located and the active layer, a first ohmic contact part located in the overlapping area between the source electrode and the active layer, and a second ohmic contact part located in the overlapping area between the drain electrode and the active layer. In response to that a turn-on voltage is applied to the gate electrode, conductive passages located between the first ohmic contact part and the second ohmic contact part, between the first ohmic contact part and the drain electrode, and further between the source electrode and the second ohmic contact part each includes the first structure part and the second structure part.

For example, each of the second structure part is embedded in one of the first structure part, and each of the first structure part is embedded therein with at least one the second structure part therein.

For example, the active layer may include a plurality of first structure parts and a plurality of the second structure parts, and a dimension of the first structure parts and the second structure parts is in the order to nanometer, each of the first structure parts is embedded therein with one of the second structure part therein.

For example, each of the first structure part fully envelopes the second structure part.

For example, the second structure part is nanometer ball, and the second structure part and the first structure part fully enveloping the second structure part are constructed into a ball shape or a ball-like shape; alternatively, the second structure part is a nanometer bar, and the second structure part and the first structure part fully enveloping the second structure part are constructed into a bar shape.

For example, dimensions of the first structure part and the second structure part both are in the order of micrometer.

For example, a dimension of the first structure part is in the order of micrometer, and a dimension of the second structure part is in the order of nanometer.

For example, the predetermined conductor includes one of metal, metal composite, and organic conductor.

An embodiment of the present invention further provides an array substrate including any one of the above described TFT.

An embodiment of the present invention further provides a display device including any one of the above described array substrate.

DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DESCRIPTION OF THE REFERENCE NUMERALS

1—gate electrode; 2—active layer; 3—source electrode; 4—drain electrode; 5a—first ohmic contact part; 5b—second ohmic contact part; 21—first structure part; 22—second structure part; 23—core-shell particle

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

It is to be noted that the directional terminologies used herein, such as "up", "down" for indicting the direction, are only intended to refer to the direction in the attached drawings and illustrate the embodiments of the present invention so as to facilitate the same to be understood, but do not in any way to limit the embodiments of the present invention. Furthermore, the thickness and shape of each of the film layers in the attached drawings are not drawn at the true scale, and are only used to illustrate the content of the embodiments of the present invention.

Figure 1A:
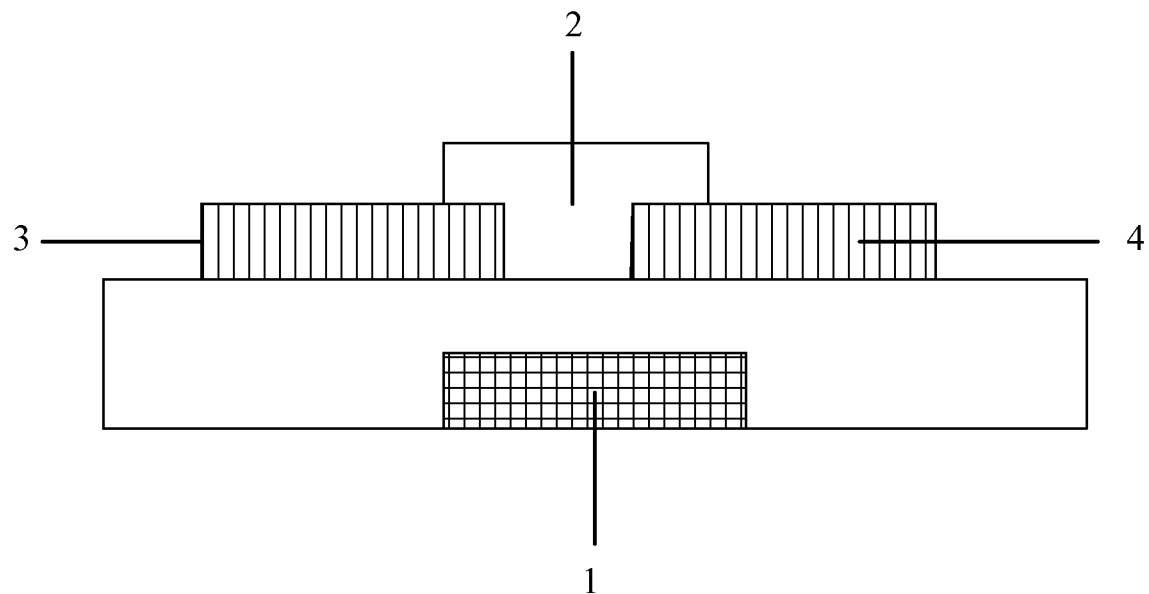
FIG. 1a and FIG. 1b are schematic views showing the structure of the TFT according to an embodiment of the present invention.

For example, as illustrated in FIG. 1a, the TFT provided by an embodiment of the present invention includes a gate electrode 1, an active layer 2 located on the gate electrode 1, and a source electrode 3 and a drain electrode 4 respectively located at opposite sides of the active layer 2 and both partially overlapped with the active layer 2.

The active layer 2 includes at least one first structure part and at least one second structure part, a material for the first structure part is semiconductor, and a material for the second structure part is predetermined conductor, and the conductivity of the predetermined conductor is better than the conductivity of the semiconductor.

When a turn-on voltage is applied to the gate electrode 1, a conductive passage between the source electrode 3 and the drain electrode 4 include the first structure part and the second structure part.

For example, when the turn-on voltage is applied to the gate electrode, the conductive passage between the source electrode and the drain electrode include the first structure part and the second structure part, electrons in the source electrode are transported to the drain electrode through the first structure part and the second structure part, and holes at the drain electrode are transported to the source electrode through the first structure part and the second structure part. When a turn-off voltage is applied to the gate electrode, the first structure part(s) is converted into non-conductive state, so that the conductive passage between the source electrode and the drain electrode is interrupted, and thus the transportation of the electrons and the holes between the source electrode and the drain electrode is interrupted.

Because when the turn-on voltage is applied to the gate electrode, the electrons at the source electrode can be transported to the drain electrode through the first structure part and the second structure part having conductivity better than that of the conducted semiconductor, and the holes at the drain electrode can be transported to the source electrode through the first structure part and the second structure part having conductivity better than that of the conducted semiconductor, the mobility of the electrons at the source electrode and that of the holes at the drain electrode are improved, and therefore the on-state current of the TFT is increased. Furthermore, since when the turn-off voltage is applied to the gate electrode, the first structure part is converted into the non-conductive state so that the transportation of the electrons and the holes between the source electrode and the drain electrode is interrupted, the off-state current of the TFT is kept constant, so that the ratio of the on-state current to the off-state current of the TFT is increased, the performance of the TFT is improved, and the possibility to enable the TFT to drive a large area display device is increased to a certain extent.

It is to be noted that, for the structure feature of the first structure part and the second structure part included in the active layer, any kind of the first structure and the second structure can be used in the embodiment of the present invention as long as they meet the conditions that: when the turn-on voltage is applied to the gate electrode, the conductive passage between the source electrode and the drain electrode includes the first structure part and the second structure part.

It is to be noted that the structure feature for the first structure part and the second structure part meeting the above condition can be carried out in many ways and cannot be exhaustively described, hereinafter, only several examples thereof will be described.

First, the structure feature of the first structure part and the second structure part is in that the source electrode and the drain electrode only at least partly contact with the first structure part.

Figure 2A:
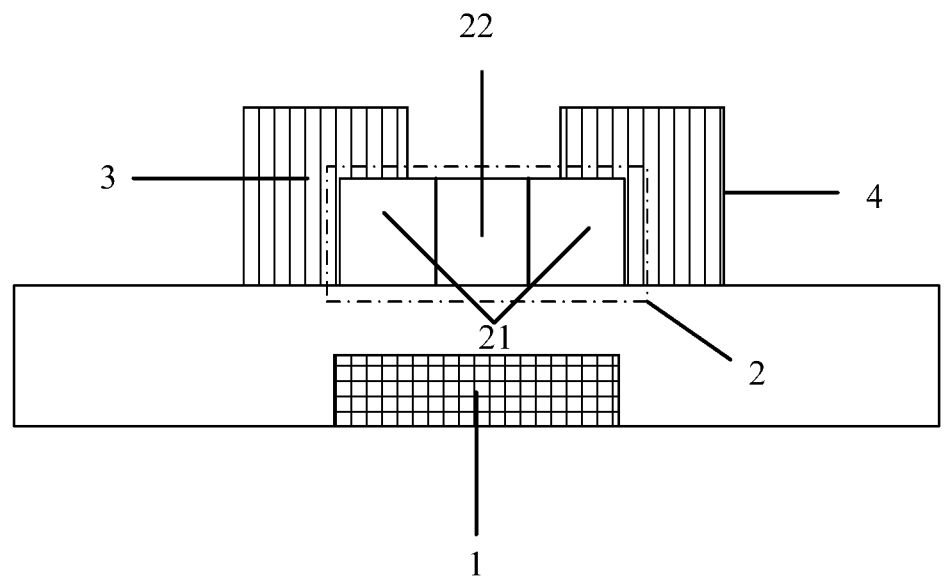
FIG. 2a to FIG. 2f are schematic views showing the structure of the active layer in an embodiment of the present invention.

For example, as illustrated in FIG. 2a, the active layer includes two first structure parts 21 and one second structure part 22, the second structure part 22 contacts with neither the source electrode 3 nor the drain electrode 4, and both ends thereof respectively contact with one of the first structure parts; one end of one of the first structure part 21 contacts with the second structure part 22, and the other end thereof contacts with the source electrode 3, one end of the other of the first structure part 21 contacts with the second structure part 22, and the other end thereof contacts with the drain electrode 4.

In implementation, as illustrated in FIG. 2a, the second structure part contacts with neither the source electrode nor the drain electrode, and a portion of one first structure part contacts with the source electrode, and the remaining portion of the first structure part contacts with the drain electrode. Because when the electrons at the source electrode and the holes at the drain electrode are transported, the material having better conductivity will be selected, when the turn-on voltage is applied to the gate electrode, the conductive passage between the source electrode and the drain electrode certainly includes the first structure part and the second structure part.

Second, the structure feature of the first structure part and the second structure part is in that: the source electrode only contacts with at least a portion of the second structure part, and the drain electrode only contacts with at least a portion of the first structure part.

Figure 2B:
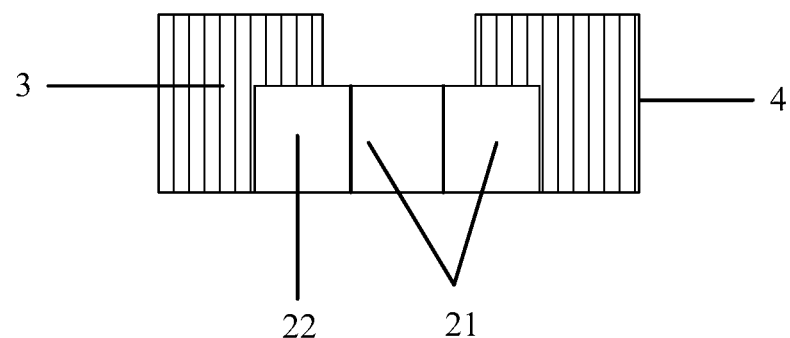

For example, as illustrated in FIG. 2b, the active layer includes two first structure parts 21 and one second structure part 22, one end of the second structure part 22 contacts with the source electrode 3, and the other end thereof contacts with one of the first structure part 21; the other end of the one of the first structure part 21 contacts with another first structure part 21, and the other end of the another first structure part 21 contacts with the drain electrode 4.

In implementation, in FIG. 2b, the second structure part contacts with the source electrode while a portion of the first structure part contacts with the drain electrode, the remaining portion of the first structure part does not contact with both the source electrode and the drain electrode. Therefore, when the turn-on voltage is applied to the gate electrode, the conductive passage between the source electrode and the drain electrode would certainly include the first structure part and the second structure part.

Third, the structure feature of the first structure part and the second structure part is in that the source electrode only contacts with at least a portion of the first structure part, and the drain electrode only contacts with at least a portion of the second structure part.

Figure 2C:
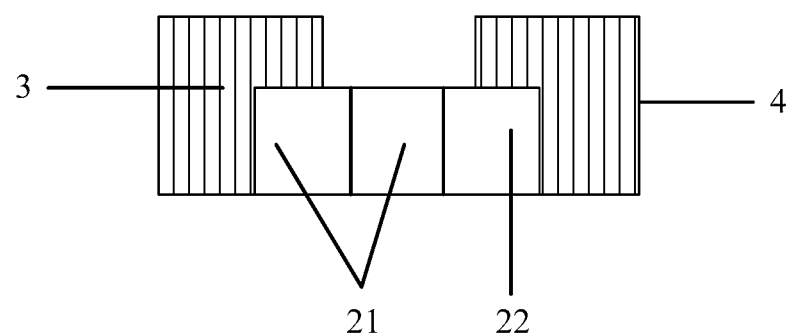

For example, as illustrated in FIG. 2c, the active layer includes two first structure parts 21 and one second structure part 22; one end of the second structure part 22 contacts with the drain electrode 4, and the other end thereof contacts with one of the first structure parts 21; and the other end of the one of the first structure parts 21 contacts with another first structure part 21, and the other end of the another first structure part 21 contacts with the source electrode 3.

In implementation, in FIG. 2c, the second structure part contacts with the drain electrode, while a portion of the first structure part contacts with the source electrode, and the remaining portion of the first structure part does not contact with both the source electrode and the drain electrode. Therefore, the conductive passage between the source electrode and the drain electrode would certainly include the first structure part and the second structure part.

Fourth, the structure feature of the first structure part and the second structure part is in that the source electrode and the drain electrode are only contacted with at least a portion of the second structure part, and when the turn-on voltage is applied to the gate electrode, the conductive passage between the source electrode and the drain electrode includes the first structure part and the second structure part.

Figure 2D:
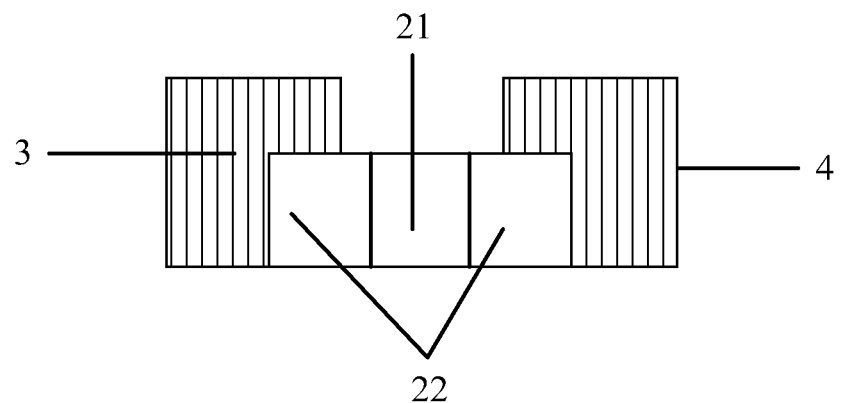

For example, as illustrated in FIG. 2d, the active layer includes one first structure part 21 and two structure parts 22; one end of one of the second structure parts 22 contacts with the source electrode 3, and one end of the other second structure part 22 contacts with the drain electrode 4, and the two ends of the first structure part 21 respectively contact with the two second structure parts 22.

In implementation, in FIG. 2d, a portion of the second structure part contacts with the source electrode, and another portion of the second structure part contacts with the drain electrode, and the first structure part and the second structure part contact with each other. Therefore, when the turn-on voltage is applied to the gate electrode, the conductive passage between the source electrode and the drain electrode includes the first structure part and the second structure part.

Fifth, the structure feature of the first structure part and the second structure part is in that the second structure part(s) is embedded in the first structure part.

Figure 2E:
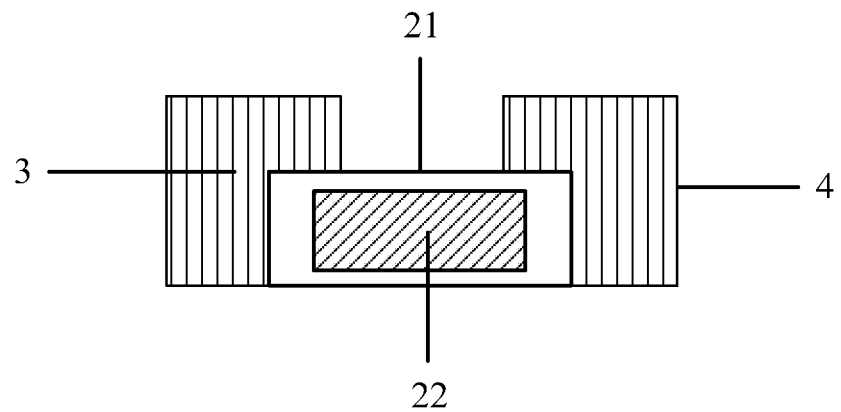

For example, as illustrated in FIG. 2e, the active layer includes one first structure part 21 and one second structure part 22; the second structure part 22 is embedded in the first structure part 21, the first structure part 21 contacts with both the source electrode 3 and the drain electrode 4, and the second structure part 22 does not contact with both the source electrode 3 and the drain electrode 4.

In implementation, in FIG. 2e, the second structure part is embedded in the first structure part, because when the electrons at the source electrode and the holes at the drain electrode are transported, the material having better conductivity will be selected, when the turn-on voltage is applied to the gate electrode, the conductive passage between the source electrode and the drain electrode would include the first structure part and the second structure part.

Figure 1B:
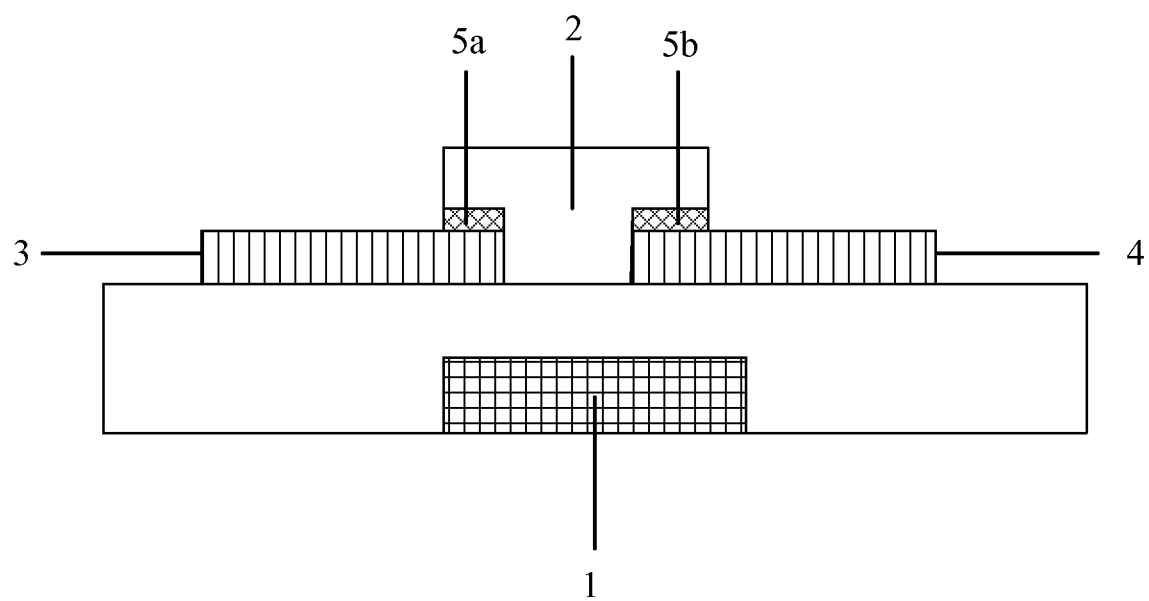

For example, as illustrated in FIG. 1b, the TFT provided by the embodiment of the present invention further includes a first ohmic contact part 5a located in the overlapping area between the source electrode 3 and the active layer 2 and a second ohmic contact part 5b located in the overlapping area between the drain electrode 4 and the active layer 2, and both parts are located between the film layer on which the source electrode 3 and the drain electrode 4 are located and the active layer 2.

When the turn-on voltage is applied to the gate electrode 1, the conductive passages located between the first ohmic contact part 5a and the second ohmic contact part 5b, between the first contact part 5a and the drain electrode 4, and further between the source electrode 3 and the second ohmic contact part 5b all include the first structure part and the second structure part.

In implementation, when the turn-on voltage is applied to the gate electrode, the conductive passages located between the source electrode and the drain electrode, between the first ohmic contact part and the second ohmic contact part, between the first contact part and the drain electrode, and further between the source electrode and the second ohmic contact part all include the first structure part and the second structure part, thus the electrons at the source electrode will all be transported to the drain electrode through the first structure part and the second structure part, and the holes at the drain electrode will all be transported to the source electrode through the first structure part and the second structure part. When the turn-off voltage is applied to the gate electrode, all the first structure part(s) is converted into non-conductive state, so that the conductive passages located between the source electrode and the drain electrode, between the first ohmic contact part and the second ohmic contact part, between the first contact part and the drain electrode, and between the source electrode and the second ohmic contact part are all cut off, and thus the transportation of the electrons and the holes between the source electrode and the drain electrode is interrupted.

Because when the turn-on voltage is applied to the gate electrode, the electrons at the source electrode can be transported to the drain electrode through the first structure part and the second structure part having conductivity better than that of the conducted semiconductor, and the holes at the drain electrode can be transported to the source electrode through the first structure part and the second structure part having conductivity better than that of the conducted semiconductor, the mobility of the electrons at the source electrode and the holes at the drain electrode is improved, and thus the on-state current of the TFT is increased. Furthermore, since when the turn-off voltage is applied to the gate electrode, all the first structure part(s) is converted into non-conductive state, the transportation of the electrons and the holes between the source electrode and the drain electrode is interrupted. Therefore, the off-state current of the TFT is kept constant, so that the ratio of the on-state current to the off-state current of the TFT is increased, the performance of the TFT is improved, and the possibility to enable the TFT to drive a large area display device is increased to a certain extent.

For example, with the provided first ohmic contact part and second ohmic contact part, the contact resistance between the source electrode and the drain electrode and the active layer, and the performance of the TFT is further improved.

It is to be noted that when the TFT provided by an embodiment of the present invention further includes the first ohmic contact part and the second ohmic contact part, any structure of the first structure part and the second structure part can be applied in the embodiment of the present invention as long as the structure feature of the first structure part and the second structure part meets the following condition that: when the turn-on voltage is applied to the gate electrode, the conductive passages located between the source electrode and the drain electrode, between the first ohmic contact part and the second ohmic contact part, between the first contact part and the drain electrode, and further between the source electrode and the second ohmic contact part all include the first structure part and the second structure part.

It is to be noted that, as for the TFT including the first ohmic contact part and the second ohmic contact part, the implementation way for the structure feature of the first structure part and the second structure part included in its active layer is similar to the implementation way for the structure feature of the first structure part and the second structure part included in the active layer in the case of the TFT excluding the first ohmic contact part and the second ohmic contact part, and will not be further described herein.

For example, from the description regarding the technical solution of the embodiment of the present invention, it can be seen that the second structure part may not be embedded in the first structure part to solve the problem that the embodiments of the present invention face. For example, as illustrated in FIG. 2a to FIG. 2d, in order to increase the ratio of the off-state current to the on-state current of the TFT as much as possible, the second structure part(s) may also be embedded in the first structure part, for example, as illustrated in FIGS. 2e to solve the problem which the embodiments of the present invention face.

Hereinafter, the solution of the embodiment of the present invention in which the second structure part(s) is embedded in the first structure part to solve the problem that the embodiments of the present invention face will be described in detail.

For example, each of the second structure parts is embedded into one first structure part, and each of the first structure parts is embedded therein with at least one second structure part therein.

For example, the second structure part(s) is embedded in the first structure part.

As for the TFT excluding the first ohmic contact part and the second ohmic contact part: when the turn-on voltage is applied to the gate electrode, the conductive passage between the source electrode and the drain electrode includes the first structure part and the second structure part, thus the ratio of the on-state current to the off-state current of the TFT is increased.

As for the TFT including the first ohmic contact part and the second ohmic contact part, when the turn-on voltage is applied to the gate electrode, the conductive passages located between the source electrode and the drain electrode, between the first ohmic contact part and the second ohmic contact part, between the first ohmic contact part and the drain electrode, and further between the source electrode and the second ohmic contact part all include the first structure part and the second structure part, thus the ratio of the on-state current to the off-state current of the TFT is increased.

For example, the dimension of the first structure part is in the order of nanometer, and also may be in the order of micrometer; similarly to the first structure part, the dimension of the second structure part is in the order of nanometer, and also may be in the order of micrometer.

Hereinafter, the implementation way in which the second structure part(s) is embedded in the first structure part according to the embodiments of the present invention will be described in detail by taking the dimension of the first structure part and the second structure part as the classification basis.

First, the dimension of the first structure part and the second structure part both are in the order of nanometer.

For example, the dimension of the first structure part and the second structure part are both in the order of nanometer, and the active layer includes a plurality of the first structure parts and a plurality of the second structure parts.

Each of the second structure parts is embedded in one of the first structure parts, and each of the first structure parts is embedded therein with one of the second structure parts.

In implementation, since the spatial dimension (for example, thickness, length, and width) of the active layer is in the order of micrometer, when the dimension of the first structure part and the second structure part is in the order of nanometer, the active layer may include a plurality of the first structure parts and a plurality of the second structure parts.

Figure 3:
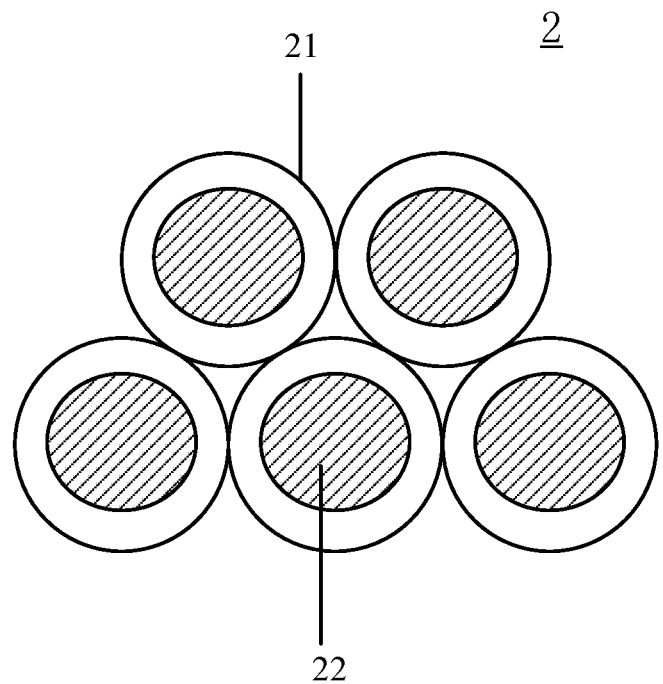
FIG. 3 is a schematic view showing the structure in which the second structure part is fully embedded in the first structure part according to an embodiment of the present invention.

For example, as illustrated in FIG. 3, each of the second structure parts 22 is fully embedded in the corresponding first structure part 21, and the first structure part 21 is not of a closed surface.

Figure 4:
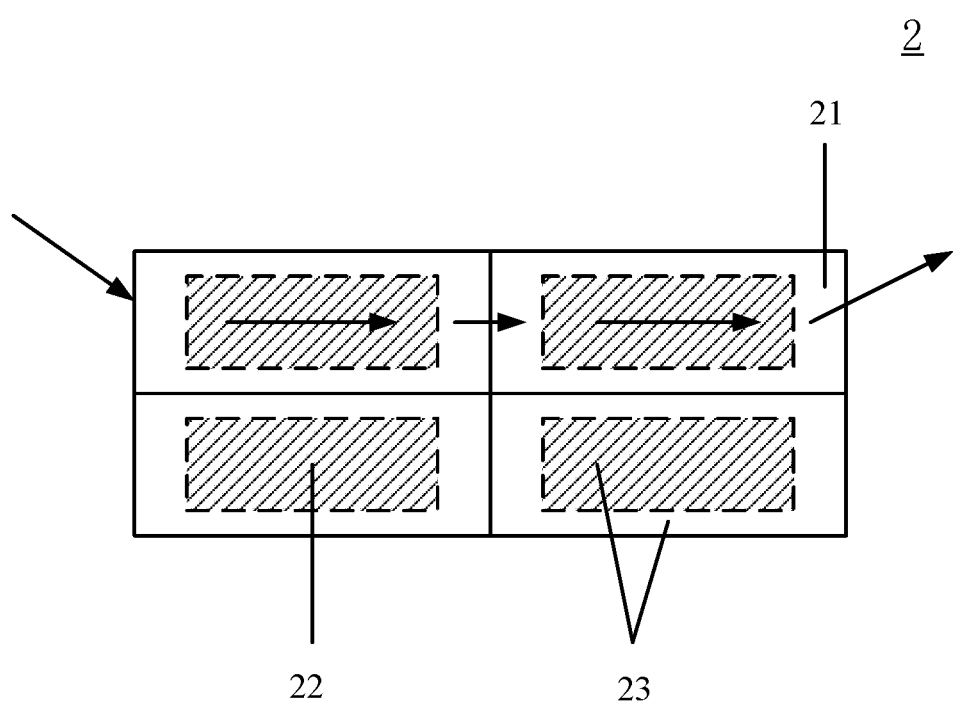
FIG. 4 is a schematic view showing the structure in which the first structure part fully envelops the second structure part according to an embodiment of the present invention.

For example, the first structure part may also be of a closed surface, for example, as illustrated in FIG. 4, each of the first structure parts 21 is a closed surface fully enveloping the second structure part 22.

In implementation, when each of the first structure part fully envelopes the second structure part, the first structure part and the second structure part may construct a shell-core particle with the second structure part being the core and the first structure part being the shell. When the turn-on voltage is applied to the gate electrode, the shell is conductive, and the electrons at the source electrode and the holes at the drain electrode can be transported through the core to have a relative large mobility, and thus the on-state current of the TFT can be increased. When the turn-off voltage is applied to the gate electrode, the shell is converted from the conductive state to the non-conductive state immediately, and therefore, the transportation of the electrons at the source electrode and the holes at the drain electrode is immediately interrupted. Thus, the on-state current of the TFT is kept constant, and hence the object of increasing the ratio of the on-state current to the off-state current of the TFT is achieved.

For example, the first structure part and the second structure part can be shaped into a regular shape, or can be of an irregular shape.

For example, as illustrated in FIG. 3, the second structure part 22 is a nanometer ball, and the second structure part 22 and the first structure part 21 fully enveloping the second structure part 22 construct ball shape or a ball-like shape; alternatively, as illustrated in FIG. 4, the second structure part 22 is a nanometer bar, and the second structure part 22 and the first structure part 21 fully enveloping the second structure part 22 construct a bar shape.

Second, the dimension of the first structure part and the second structure part is in the order of micrometer.

For example, the dimension of the first structure part and the second structure part is in the order of micrometer, each of the second structure part is embedded in one of the first structure part, and each of the first structure parts is embedded therein with at least one of the second structure parts.

In implementation, since the spatial dimension (for example, thickness, length and width) of the active layer is in the order of micrometer, when the dimension of the first structure part and the second structure part is in the order of micrometer, the active layer includes at least one first structure part 21 and at least one second structure part 22.

For example, by considering the example that the active layer includes one first structure part and one second structure part, as illustrated in FIG. 2e, the active layer 2 includes one first structure part 21 and one second structure part 22, and the second structure part 22 is embedded in the first structure part 21.

For example, the first structure part and the second structure part may be shaped to be a regular shape, and may also be of an irregular shape.

For example, the shape of the first structure part and the shape of the second structure part embedded in the first structure part are identical with the shape of an ordinary active layer.

Third, the dimension of the first structure part is in the order of micrometer, and the dimension of the second structure part is in the order of nanometer.

For example, the dimension of the first structure part is in the order of micrometer, and the dimension of the second structure part is in the order of nanometer, each of the second structure parts is embedded in one of the first structure parts, and each of the first structure parts is embedded therein with at least one of the second structure parts.

For example, since the spatial dimension (for example, thickness, length and width) of the active layer is in the order of micrometer, when the dimension of the first structure part is in the order of micrometer and the dimension of the second structure part is in the order of nanometer, the active layer includes at least one first structure part and at least one second structure part.

Figure 2F:
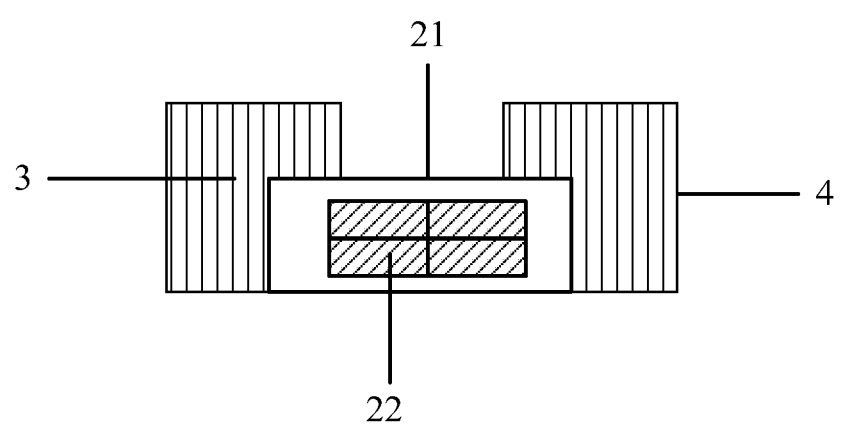

For example, the active layer includes one first structure part and a plurality of second structure parts, as illustrated in FIG. 2f, the active layer includes one first structure part 21 and four second structure parts 22, and the second structure parts 22 are embedded in the first structure part 21.

For example, the first structure part and the second structure part may be shaped to be a regular shape, and may also be of an irregular shape.

For example, the shape of the first structure part and the shape of the second structure part embedded in the first structure part are identical with the shape of an ordinary active layer.

For example, the predetermined conductor is any one kind of conductor having conductivity better than the conducted semiconductor.

For example, the predetermined conductor includes any one of metal, metal composite, and organic conductor.

For example, the material for the first structure part is any kind of semiconductor, such as amorphous silicon semiconductor, poly-silicon semiconductor, monocrystalline semiconductor, metal compound semiconductor, or organic semiconductor.

For example, the material for the first structure part is metal compound semiconductor, such as zinc oxide, zinc sulfide, or indium gallium zinc oxide.

For example, the structure that the second structure part is embedded in the first structure part can be formed by any ordinary method such as physical method, chemical method, or the combination of the physical method and chemical method.

Hereinafter, the embodiment of the manufacturing method for making the structure in which the second structure part is embedded in the first structure part will be described in detail based on the order of the dimension of the first structure part and the second structure part.

First, the dimension of the first structure part and the dimension of the second structure part are in the order of nanometer, and the active layer includes a plurality of first structure parts and a plurality of second structure parts, each of the second structure parts is embedded in one of the first structure parts, and each of the first structure part is embedded therein with one of the second structure parts.

Hereinafter, the embodiment of the method for preparing the shell-core particle, in which the second structure part in the order of nanometer is formed as the core and the first structure part in the order of nanometer is formed as the shell (that is, the first structure part in the order of nanometer fully enveloping the second structure part in the order of nanometer) will be described in detail.

For example, when the material for the second structure part is a metal, the shell-core particles, in which the second structure part is the core and the first structure part is the shell, can be made by one or more method selected from the ordinary template based method, metal seed reduction method, sol-gel method, chemical reduction method, chemical reduction sol-gel method, microwave assistant polyol method, laser assistant synthesis method, percolation method, thermal treatment method, photochemical method, or the like. For example, the core-shell particle with the second structure part being the core and the first structure part being the shell will be described by way of example, by taking the sol-gel method as an example.

For example, when the material for the second structure part is a metal, the method for making the core-shell particle, with the second structure part being the core and the first structure part being the shell, includes synthesizing the metal second structure part by using a chemical reduction method, preparing the core-shell particle, with the second structure part being the core and the first structure part being the shell, by taking the metal second structure part as a seed and by sol-gel reacting the first structure part on the surface of the seed.

For example, when the material for the second structure part is any one of the predetermined conductors, the method for making the core-shell particle, with the second structure part being the core and the first structure part being the shell, can refer to the article published in an international journal, "Journal of the American Chemical Society, Chem, Rev. 2012, 112, 2373-2433," which disclosed a general method for wrapping the first structure part over the surface of the second structure part.

Second, the dimension of the first structure part and the second structure part is in the order of micrometer, and each of the second structure part is embedded in one of the first structure parts, and each of the first structure parts is embedded therein with one of the second structure parts.

For example, the method for forming the structure in which the second structure part in the order of micrometer is embedded in the first structure part in the order of micrometer includes: forming the second structure part in the order of micrometer by an ordinary method; wrapping the outer surface of the second structure part in the order of micrometer by using the second structure part in a molten state, and when the outer surfaces of the second structure parts in the order of micrometer are all wrapped with a layer of the second structure part, curing the second structure part in the molten state.

Third, the dimension of the first structure part is in the order of micrometer, and the dimension of the second structure part is in the order of nanometer, and each of the second structure part is embedded in one of the first structure parts, and each of the first structure parts is embedded therein with at least one of the second structure parts.

For example, after the second structure part in the order of nanometer is obtained, with the method similar to that for forming the structure in which the second structure part in the order of micrometer is embedded in the first structure part in the order of micrometer, the structure in which the second structure part in the order of nanometer is embedded in the first structure part in the order of micrometer is formed.

For example, the method for preparing the TFT according to the embodiments of the present invention is similar to the ordinary method for preparing a TFT, for example, after the gate electrode and the source electrode as well as the source electrode are formed by a conventional matured process, with a printing method, the active layer is applied onto the film layer on which the source electrode and the drain electrode are located; alternatively, after the gate electrode is formed by a conventional matured process, by coating and etching method, the active layer is formed on the gate electrode, and then the source electrode and the drain electrode are formed according to a conventional matured process.

For example, forming the gate electrode by the conventional established process includes forming the gate electrode by screen printing method.

For example, forming the source electrode and the drain electrode by the conventional established process includes forming the source electrode and the drain electrode by a screen printing method.

For example, application of the active layer onto the film layer on which the source electrode and the drain electrode are located by a printing method includes filling the active layer on the film layer on which the source electrode and the drain electrode are located with an ink jet printer.

EXAMPLES

As illustrated in FIG. 4, the active layer includes a plurality of core-shell particles 23, with the second structure part 22 being the core and the first structure part 21 being the shell, the core-shell particles 23 are of a bar-like shape, for example, the second structure part 22 (that is, the central core) may employ metal Zn, and the first structure part 21 (that is, the shell enveloping outside) may employ semiconductors such as zinc oxide, zinc sulfide, or indium gallium zinc.

When the turn-on voltage is applied to the gate electrode, the first structure part 21 is converted from cut-off state to conduction state, and the electrons at the source electrode can be transported to the drain electrode from the source electrode, and since the second structure part 22 is formed of a metal having good conductivity, the electrons at the source electrode will select to pass through the second structure part 22 having better conductivity when being transported through the first structure part 21. This is the case also for the holes at the drain electrode. Therefore, compared with the ordinary TFT, since a portion of the conductive passage (for transporting the electrons at the source electrode and the holes at the drain electrode) has high mobility, the on-state current of the TFT is increased. When the turn-off voltage is applied to the gate electrode, the first structure part 21 is converted from the conduction state to the cutoff state, the transportation of the electrons and the holes between the source electrode and the drain electrode is interrupted. Therefore, compared with the ordinary TFT, the off-state current of the TFT is kept constant. Thus, the ratio of the on-state current to the off-state current of the TFT is increased, and the performance of the TFT is improved.

The embodiments of the present invention further provide an array substrate including any one of the TFTs according to the embodiments of the present invention.

Since the ratio of the on-state current to the off-state current of the TFT according to the embodiments of the present invention is increased, it is possible to enable the array substrate including the TFT according to the embodiments of the present invention to be applied in a large area display device.

The embodiments of the present invention further provide a display device including any one of the array substrates according to the embodiments of the present invention.

Since the array substrate according to the embodiments of the present invention can be applied in a large area display device, the display device including the array substrate according to any of the embodiments of the present invention may have better operation performance even if it is a large area display device.

For example, the display device may be a liquid crystal display panel, an electronic paper, an OLED (Organic Light Emitting Diode) panel, a mobile phone, a tablet computer, a television, a display, a laptop computer, a digital photo frame, a navigator, or any product or component having display function.

In the embodiments of the present invention, at least one of the following benefits can be achieved.

In the embodiment of the present invention, the TFT includes a gate electrode, an active layer located over the gate electrode, and a source electrode and a drain electrode respectively provided at opposite sides of the active layer and both partially overlapped with the active layer. The active layer includes at least one first structure part and at least one second structure part, a material for the first structure part is semiconductor, and a material for the second structure part is predetermined conductor having better conductivity than the conducted semiconductor. Wherein in response to that a turn-on voltage is applied to the gate electrode, a conductive passage located between the source electrode and the drain electrode includes the first structure part and the second structure part.

When a turn-off voltage is applied to the gate electrode, the conductive passage located between the source electrode and the drain electrode includes the first structure part and the second structure part, electrons at the source electrode are transported to the drain electrode through the first structure part and the second structure part, and holes at the drain electrode are transported to the source electrode through the first structure part and the second structure part. When a turn-off voltage is applied to the gate electrode, the first structure part(s) is converted into non-conductive state, so that the conductive passage between the source electrode and the drain electrode is interrupted, and thus the transportation of the electrons and the holes between the source electrode and the drain electrode is interrupted.

Because when the turn-on voltage is applied to the gate electrode, the electrons at the source electrode can be transported to the drain electrode through the first structure part and the second structure part having better conductivity than that of the conducted semiconductor, and the holes at the drain electrode can be transported to the source electrode through the first structure part and the second structure part having better conductivity than that of the conducted semiconductor, the mobility of the electrons at the source electrode and the holes at the drain electrode is improved, and thus the on-state current of the TFT is increased. Furthermore, since when the turn-off voltage is applied to the gate electrode, all the first structure part(s) is converted into non-conductive state, the transportation of the electrons and the holes between the source electrode and the drain electrode is interrupted. Therefore, the off-state current of the TFT is kept constant, so that the ratio of the on-state current to the off-state current of the TFT is increased, and the TFT is enabled to effectively drive a large area display device.

The present disclosure has been described above by way of the exemplary embodiment, and the protection scope of the present disclosure would not be limited therein, and is only defined by the following claims.

The present application claims the priority of Chinese Patent Application No. 201410456916.8 filed on Sep. 10, 2014, the Chinese Patent Application is entirely incorporated herein by reference as a part of the present application.

What is claimed is:

1. A thin film transistor comprising a gate electrode, an active layer located over the gate electrode, and a source electrode and a drain electrode respectively located at opposite sides of the active layer and both partially overlapped with the active layer, wherein:
   the active layer includes a plurality of first structure parts and a plurality of second structure parts, a material for each of the first structure parts is a semiconductor, and a material for each of the second structure parts is a predetermined conductor, and the predetermined conductor has better conductivity than a conductivity of the semiconductor, wherein each of the second structure parts is embedded within one of the first structure parts, and each of the first structure parts has at least one of the second structure parts embedded within this first structure part;
   the first structure parts fully envelope the corresponding second structure parts; and
   in response to a turn-on voltage being applied to the gate electrode, a conductive passage located between the source electrode and the drain electrode includes the plurality of first structure parts and the plurality of second structure parts.

2. The thin film transistor according to claim 1, further comprising, between a film layer on which the source electrode and the drain electrode are located and the active layer, a first ohmic contact part located in an overlapping area between the source electrode and the active layer, and a second ohmic contact part located in an overlapping area between the drain electrode and the active layer,
   wherein in response to the turn-on voltage being applied to the gate electrode, conductive passages located between the first ohmic contact part and the second ohmic contact part, between the first ohmic contact part and the drain electrode, and further between the source electrode and the second ohmic contact part all include the first structure part and the second structure part.

3. The thin film transistor according to claim 1, wherein a dimension of each of the first structure parts and a dimension of each of the second structure parts both are in nano-scale.

4. The thin film transistor according to claim 1, wherein each of the second structure parts is a nanometer ball, and each of the second structure parts and each of the first structure parts enveloping the corresponding second structure parts construct a ball shape or a ball-like shape; alternatively
   each of the second structure parts is a nanometer bar, and each of the second structure parts and each of the first structure parts enveloping the corresponding second structure parts construct a bar shape.

5. The thin film transistor according to claim 1, wherein a dimension of each of the first structure parts and a dimension of each of the second structure parts both are in micrometer scale.

6. The thin film transistor according to claim 1, wherein a dimension of each of the first structure parts is in micrometer scale, and a dimension of each of the second structure parts is in nano-scale.

7. The thin film transistor according to claim 1, wherein the predetermined conductor includes any one selected from metal, metal composite, and organic conductor.

8. An array substrate including the thin film transistor according to claim 1.

9. A display device including the array substrate according to claim 8.

10. The thin film transistor according to claim 2, wherein a dimension of each of the first structure parts and a dimension of each of the second structure parts both are in nano-scale.

11. The thin film transistor according to claim 3, wherein each of the second structure parts is a nanometer ball, and each of the second structure parts and each of the first structure parts enveloping the corresponding second structure parts construct a ball shape or a ball-like shape; alternatively
   each of the second structure parts is a nanometer bar, and each of the second structure parts and each of the first structure parts enveloping the corresponding second structure parts construct a bar shape.

12. The thin film transistor according to claim 1, wherein each of the second structure parts is a nanometer ball, and each of the second structure parts and each of the first structure parts enveloping the corresponding second structure parts construct a ball shape or a ball-like shape; alternatively each of the second structure parts is a nanometer bar, and each of the second structure parts and each of the first structure parts enveloping the corresponding second structure parts construct a bar shape.

13. The thin film transistor according to claim 10, wherein each of the second structure parts is a nanometer ball, and each of the second structure parts and each of the first structure parts enveloping the corresponding second structure parts construct a ball shape or a ball-like shape; alternatively each of the second structure parts is a nanometer bar, and each of the second structure parts and each of the first structure parts enveloping the corresponding second structure parts construct a bar shape.

14. The thin film transistor according to claim 2, wherein a dimension of each of the first structure parts and a dimension of each of the second structure parts both are in micrometer scale.

15. The thin film transistor according to claim 2, wherein a dimension of each of the first structure parts is in micrometer scale, and a dimension of each of the second structure parts both are in nano-scale.

\* \* \* \* \*

UNITED STATES PATENT AND TRADEMARK OFFICE
CERTIFICATE OF CORRECTION

PATENT NO. : 9,793,361 B2  
APPLICATION NO. : 14/770652  
DATED : October 17, 2017  
INVENTOR(S) : Zeng et al.

It is certified that error appears in the above-identified patent and that said Letters Patent is hereby corrected as shown below:

On the Title Page

Item (30) Foreign Application Priority Data, Column 1, Line 2:  
Delete "2014 1 056916" and insert --201410456916.8--

Signed and Sealed this  
Second Day of March, 2021

Drew Hirshfeld  
*Performing the Functions and Duties of the*  
*Under Secretary of Commerce for Intellectual Property and*  
*Director of the United States Patent and Trademark Office*